United States Patent
Lin et al.

(10) Patent No.: US 9,117,051 B2
(45) Date of Patent: Aug. 25, 2015

(54) HIGH DENSITY FIELD EFFECT TRANSISTOR DESIGN INCLUDING A BROKEN GATE LINE

(71) Applicants: International Business Machines Corporation, Armonk, NY (US); Samsung Electronics Co., Ltd., Gyeonggi-do (KR)

(72) Inventors: Chieh-yu Lin, Hopewell Junction, NY (US); Kehan Tian, Poughkeepsie, NY (US); Sanghoon Baek, Seoul (KR)

(73) Assignees: INTERNATIONAL BUSINESS MACHINES CORPORATION, Armonk, NY (US); SAMSUNG ELECTRONICS CO., LTD., Gyeonggi-Do (KR)

( * ) Notice: Subject to any disclaimer, the term of this patent is extended or adjusted under 35 U.S.C. 154(b) by 115 days.

(21) Appl. No.: 14/059,093

(22) Filed: Oct. 21, 2013

(65) Prior Publication Data

US 2015/0111367 A1    Apr. 23, 2015

(51) Int. Cl.
*G06F 17/50* (2006.01)
*H01L 21/033* (2006.01)
*H01L 21/8234* (2006.01)

(52) U.S. Cl.
CPC ........ *G06F 17/5072* (2013.01); *H01L 21/0338* (2013.01); *H01L 21/823475* (2013.01)

(58) Field of Classification Search
CPC ............................... G06F 17/5081; G03F 1/36
USPC ........................................................ 716/55
See application file for complete search history.

(56) References Cited

U.S. PATENT DOCUMENTS

| | | | |
|---|---|---|---|
| 8,193,058 B2* | 6/2012 | Ide et al. | 438/261 |
| 8,234,603 B2 | 7/2012 | Bagheri et al. | |
| 8,266,554 B2 | 9/2012 | Bagheri et al. | |
| 8,351,037 B2 | 1/2013 | Azpiroz et al. | |
| 8,372,565 B2 | 2/2013 | Tian et al. | |
| 2004/0078763 A1* | 4/2004 | Lippincott | 716/2 |
| 2006/0190919 A1* | 8/2006 | Zhang et al. | 716/21 |
| 2007/0128526 A1* | 6/2007 | Wallace et al. | 430/5 |
| 2009/0300567 A1* | 12/2009 | Rathsack et al. | 716/8 |
| 2010/0093143 A1* | 4/2010 | Ide et al. | 438/261 |
| 2012/0331425 A1* | 12/2012 | Blatchford | 716/52 |

* cited by examiner

*Primary Examiner* — Suchin Parihar
(74) *Attorney, Agent, or Firm* — Scully, Scott, Murphy & Presser, P.C.; Yuanmin Cai

(57) ABSTRACT

A design layout includes a set of active region-level design shapes representing semiconductor active regions, and a set of gate-level design shapes representing gate lines straddling the semiconductor active regions. The set of gate-level design shapes include a sub-resolution assist feature (SRAF) that connects two gate-level design shapes, and is physically manifested as a gap between two gate lines upon printing employing lithographic methods. An edge of a gate line in proximity to a semiconductor active region can be cut employing a cut mask that includes a cut-level design shape that has a protruding tap. The protruding tap allows reliable removal of an end portion of a gate line and prevents disruption of raised source and drain regions by an unwanted residual gate structure.

20 Claims, 12 Drawing Sheets

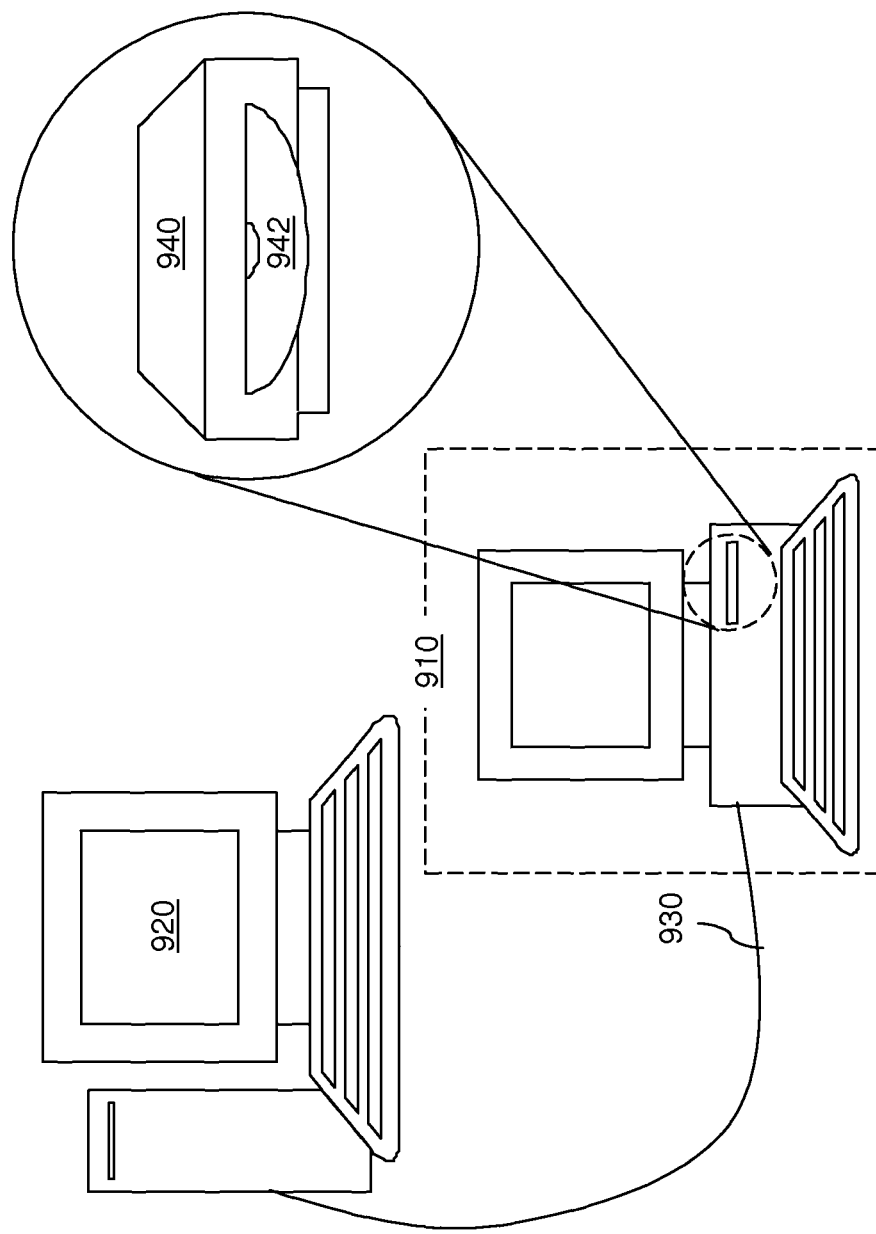

HIGH DENSITY FIELD EFFECT TRANSISTOR DESIGN INCLUDING A BROKEN GATE LINE

BACKGROUND

The present disclosure relates to a method of manufacturing a semiconductor structure, and particularly to a method of manufacturing a semiconductor structure including high density field effect transistors, and a method of generating a design layout for implementing the same.

Printing a lithographic pattern having pitches below lithographic limits of traditional lithographic techniques, e.g., below 80 nm, does not yield patterns with high fidelity. To overcome this problem, design layouts employ periodic patterns including dummy structures and cut masks that remove the dummy structures while preserving device structures. However, continued scaling of semiconductor devices have made it difficult to consistently remove dummy structures without unintended residue structures while protecting device structures. Particularly, making precise cuts to gate structures straddling semiconductor active regions has become very challenging due to the small dimensions in high density semiconductor circuits.

SUMMARY

A design layout includes a set of active region-level design shapes representing semiconductor active regions, and a set of gate-level design shapes representing gate lines straddling the semiconductor active regions. The set of gate-level design shapes include a sub-resolution assist feature (SRAF) that connects two gate-level design shapes, and is physically manifested as a gap between two gate lines upon printing employing lithographic methods. An edge of a gate line in proximity to a semiconductor active region can be cut employing a cut mask that includes a cut-level design shape that has a protruding tap. The protruding tap allows reliable removal of an end portion of a gate line and prevents disruption of raised source and drain regions by an unwanted residual gate structure.

According to an aspect of the present disclosure, a method for generating shapes for a design layout is provided. A design layout including a plurality of gate line design shapes and active region design shapes is provided. A region in the design layout is provided such that the region includes a first gate line design shape representing a first gate line, a second gate line design shape representing a second gate line, and a third gate line design shape representing a third gate line, and lengthwise edges of the first gate line design shape are collinear with lengthwise edges of the second gate line design shape, a widthwise edge of the first gate line design shape is spaced from a widthwise edge of the second gate line design shape by at least one portion of one or more active region design shapes representing one or more semiconductor active regions, and the third gate line design shape defining a boundary of the region, is parallel to the first and second gate line design shapes, and extends along a lengthwise direction farther than the widthwise edge of the first gate line design shape and the second gate line design shape. A sub-resolution assist feature (SRAF) design shape is generated, and is added to the design layout by running an automated program on a computer including one or more processors in communication with a memory and configured to run the automated program. The SRAF design shape has a lesser width than the first and second gate line design shapes and is adjoined to the widthwise edges of the first and second gate line design shapes and straddles the at least one portion of the one or more active region design shapes.

According to another aspect of the present disclosure, a method of manufacturing a semiconductor structure is provided. To generate modified design layout, a design layout including a plurality of gate line design shapes and active region design shapes is provided. A region in the design layout is provided such that the region includes a first gate line design shape representing a first gate line, a second gate line design shape representing a second gate line, and a third gate line design shape representing a third gate line, and lengthwise edges of the first gate line design shape are collinear with lengthwise edges of the second gate line design shape, a widthwise edge of the first gate line design shape is spaced from a widthwise edge of the second gate line design shape by at least one portion of one or more active region design shapes representing one or more semiconductor active regions, and the third gate line design shape defining a boundary of the region, is parallel to the first and second gate line design shapes, and extends along a lengthwise direction farther than the widthwise edge of the first gate line design shape and the second gate line design shape. A sub-resolution assist feature (SRAF) design shape is generated, and is added to the design layout by running an automated program on a computer including one or more processors in communication with a memory and configured to run the automated program. The SRAF design shape has a lesser width than the first and second gate line design shapes and is adjoined to the widthwise edges of the first and second gate line design shapes and straddles the at least one portion of the one or more active region design shapes. A set of lithographic masks derived from the generated modified design layout can be manufactured. A semiconductor structure including a plurality of semiconductor active regions and a plurality of gate line structures is manufactured employing the set of lithographic masks to pattern the semiconductor structure.

According to yet another aspect of the present disclosure, a system for generating shapes for a design layout is provided. The system includes one or more processors in communication with a memory and configured to run an automated program. The automated program includes instructions, which when executed by the computer, performs various processing steps. The processing steps of the automated program include steps of receiving a design layout including a plurality of gate line design shapes and active region design shapes, and identifying a region in the design layout, the region including a first gate line design shape representing a first gate line, a second gate line design shape representing a second gate line, and a third gate line design shape representing a third gate line. Lengthwise edges of the first gate line design shape are collinear with lengthwise edges of the second gate line design shape, a widthwise edge of the first gate line design shape is spaced from a widthwise edge of the second gate line design shape by at least one portion of one or more active region design shapes representing one or more semiconductor active regions, and the third gate line design shape defining a boundary of the region, is parallel to the first and second gate line design shapes, and extends along a lengthwise direction farther than the widthwise edge of the first gate line design shape and the second gate line design shape. The processing steps of the automated program further include a step of generating, and adding to the design layout, a sub-resolution assist feature (SRAF) design shape. The SRAF design shape has a lesser width than the first and second gate line design shapes and is adjoined to the widthwise edges of the first and second gate line design shapes and straddles the at least one portion of the one or more active region design shapes.

BRIEF DESCRIPTION OF SEVERAL VIEWS OF THE DRAWINGS

FIG. 11 is an exemplary system for performing the methods of the present disclosure.

DETAILED DESCRIPTION

Figure 1:
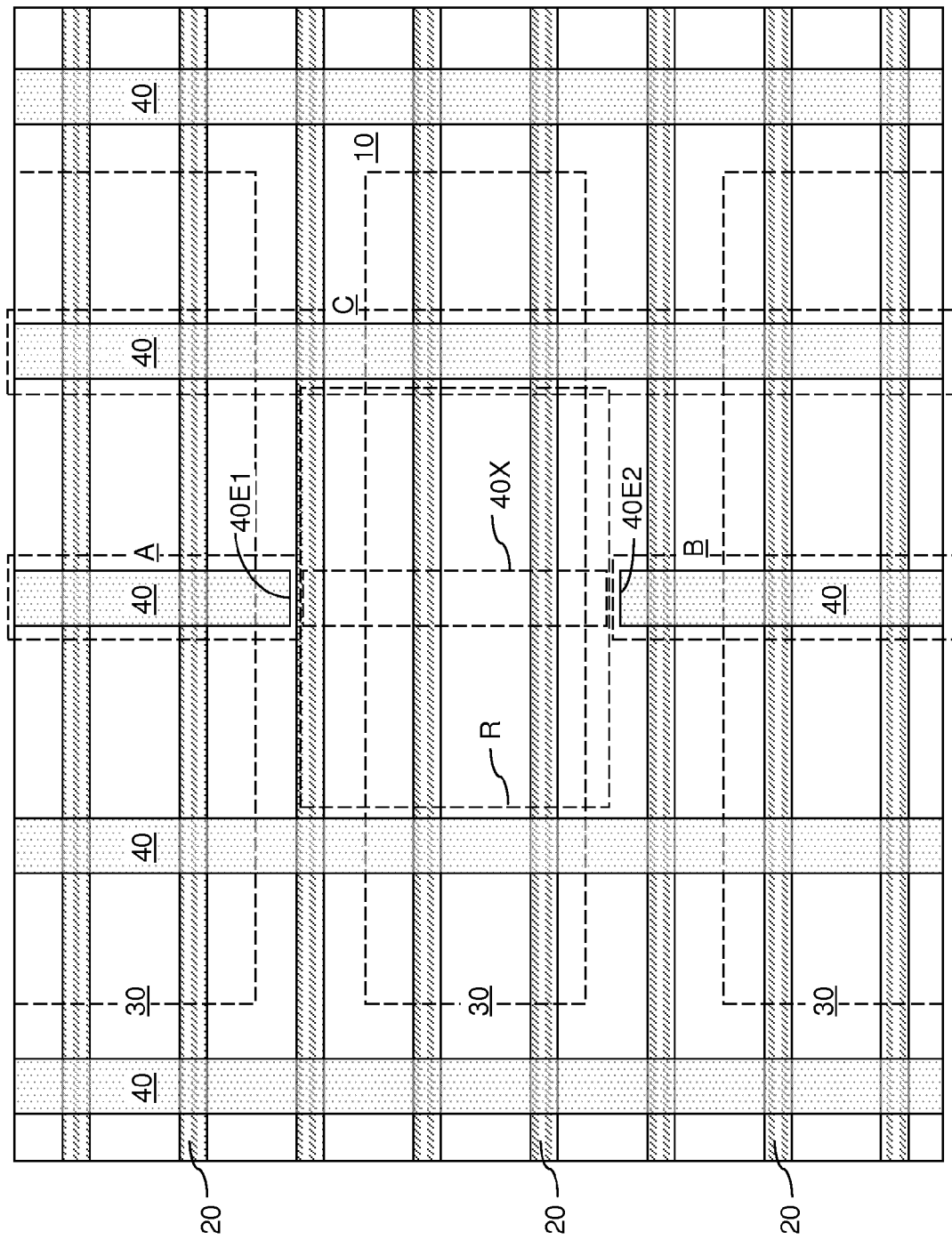
FIG. 1 is an exemplary design layout including a region containing a break in a gate line over at least one semiconductor active region as provided prior to alteration according to an embodiment of the present disclosure.

As stated above, the present disclosure relates to a method of generating a method of manufacturing a semiconductor structure including high density field effect transistors, and a method of generating a design layout for implementing the same. Aspects of the present disclosure are now described in detail with accompanying figures. It is noted that like and corresponding elements are referred to by like reference numerals. The drawings are not drawn to scale. Ordinals are used merely to distinguish among similar elements, and different ordinals may be employed across the specification and the claims of the instant application.

According to an embodiment of the present disclosure, a design layout including a plurality of gate line design shapes and active region design shapes is provided. Referring to FIG. 1, a region of an exemplary design layout that can be used to perform various steps of an embodiment of the present disclosure is illustrated. As used herein, a "design layout" refers to a set of data representing geometrical relations among a set of physical structures that can be manufactured. The exemplary design layout can be a design layout for a semiconductor structure that includes at least one field effect transistor. In one embodiment, the exemplary design layout can represent a set of semiconductor devices including at least one field effect transistor. As used herein, a "field effect transistor" refers to a field effect transistor formed on a semiconductor active region. As used herein, a "semiconductor active region" refers to a semiconductor material portion including a pair of parallel vertical sidewalls. The width of a semiconductor active region can be uniform along the lengthwise direction of the semiconductor active region.

The exemplary design layout can include a device region design shape 10, which represents the area of a semiconductor substrate on which various semiconductor devices are to be formed. A plurality of active region design shapes 20 are provided in the exemplary design layout. The plurality of active region design shapes 20 represent a plurality of semiconductor active regions that can be manufactured on a substrate. The direction along which each active region design shape 20 extends is herein referred to as a lengthwise direction of the active region design shape. The lengthwise directions of the active region design shapes 20 can be the same. In this case, the active region design shapes 20 are parallel to one another, and can constitute a one-dimensional periodic array. As used herein, an "active region" refers to a semiconductor region through which electrical current passes, and includes source regions, drain regions, and body regions of field effect transistors. In one embodiment, the active region design shapes 20 can represent semiconductor fins having a pair of parallel vertical sidewalls as known in the art. In another embodiment, the active region design shapes 20 can represent a planar semiconductor region having a uniform thickness and laterally surrounded by a shallow trench isolation structure including a dielectric material.

In the exemplary design layout, the active region design shapes 20 have a same lengthwise direction that is the horizontal direction, and have a periodicity along the direction perpendicular to the lengthwise direction, i.e., along the vertical direction. In one embodiment, the width of each active region design shape 20 can be a lithographic minimum dimension. As used herein, a "lithographic minimum dimension" refers to the smallest dimension that is allowed under the constraints of the process assumptions employed to design a design layout. In one embodiment, the pitch of the plurality active region design shapes 20 can be a lithographic minimum pitch, i.e., the minimum pitch that is allowed under the constraints of the process assumptions employed to design the exemplary design layout. In an illustrative example, the active region design shapes 20 can have a width in a range from 20 nm to 40 nm, and a pitch in a range from 40 nm to 80 nm, although lesser and greater dimensions can be employed depending on the capability of lithographic tools available or to become available in the future.

The plurality of active region design shapes 20 can be employed to form a active region level mask, which is a lithographic mask that can be employed to pattern semiconductor active regions out of a semiconductor material layer on a substrate. If the plurality of active region design shapes 20 includes a one-dimensional periodic array of line and space patterns, the semiconductor active regions as formed on the substrate can be a periodic array of semiconductor active regions having a uniform width and having a same pitch throughout.

The exemplary design layout can include active region design shapes 30. The active region design shapes 30 can be block mask level design shapes, which can be employed to form a block level mask that defines an area in which semiconductor active regions formed employing the active region level mask are to be preserved during patterning of the semiconductor active regions. Portions of the semiconductor active regions underlying a masking material portion are preserved, while other portions of the semiconductor active regions that do not underlie the masking material portion are removed, for example, by an anisotropic etch. The areas of the active region design shapes 30 within the exemplary design layout correspond to the physical areas of a semiconductor structure that can be manufactured in which patterned semiconductor active regions are to be preserved. The areas outside of the active region design shapes 30 correspond to the physical areas of the semiconductor structure from which semiconductor active region portions are to be removed, for example, by an etch.

The exemplary design layout can include gate line design shapes 40. The plurality of gate line design shapes 40 represent a plurality of gate lines that can be manufactured on a substrate. Each gate line can include a vertical stack of a gate dielectric and a gate conductor. The direction along which each active region design shape 20 extends is herein referred to as a lengthwise direction of the active region design shape 20. The lengthwise directions of the gate line design shapes 40 can be the same. In this case, the gate line design shapes 40 are parallel to one another, and can constitute a one-dimensional periodic array.

In the exemplary design layout, the gate line design shapes 40 have a same lengthwise direction that is the vertical direction, and have a periodicity along the direction perpendicular to the lengthwise direction, i.e., along the horizontal direction. In one embodiment, the width of each gate line design shape 40 can be a lithographic minimum dimension. In one embodiment, the pitch of the plurality of gate line design shapes 40 can be a lithographic minimum pitch. In an illustrative example, the gate line design shapes 40 can have a width in a range from 20 nm to 40 nm, and a pitch in a range from 40 nm to 80 nm, although lesser and greater dimensions can be employed depending on the capability of lithographic tools available or to become available in the future.

In one embodiment, each of the active region design shapes 20 and the gate line design shapes 40 can include one dimensional periodic array of design shapes, and the lengthwise direction of the active region design shapes 20 and the lengthwise direction of the gate line design shapes 40 can be perpendicular to each other.

Each gate line design shape 40 represents a gate line to be manufactured on the substrate. The gate line design shapes 40 include at least one pair of design shapes 40 having lengthwise edges located at a common pair of parallel lines and spaced from each other along the lengthwise direction. For example, the exemplary design layout includes a first gate line design shape 40 located within an area A and representing a first gate line, a second gate line design shape 40 located within an area B and representing a second gate line, and a third gate line design shape 40 located within an area C and representing a third gate line. The lengthwise edges of the first gate line design shape 40 in area A are collinear with lengthwise edges of the second gate line design shape 40 in area B.

A first widthwise edge 40E1 of the first gate line design shape 40 in area A is spaced from a second widthwise edge 40E2 of the second gate line design shape 40 in area B by at least one portion of one or more active region design shapes 40 representing one or more semiconductor active regions. The third gate line design shape 40 in area C defines a boundary of the region R, is parallel to the first and second gate line design shapes 40 in areas A and C. The third gate line design shape in area C extends along the lengthwise direction farther than the distance between the widthwise edges (40E1, 40E2) of the first gate line design shape 40 in area A and the second gate line design shape 40 in area B. In other words, the first gate line design shape 40 in area A and the second gate line design shape 40 in area B are spaced from each other by a gate line break region 40X in which a discontinuity in gate line design shapes exists between the first gate line design shape 40 in area A and the second gate line design shape 40 in area B.

Upon representation in a graphical format such as the illustrated region of the design layout, the exemplary design layout can include a region R in which a break in a gate line is present over at least one semiconductor active region. In an illustrative example, the first gate line design shape 40 in area A and the second gate line design shape 40 in area B and additional gate line design shapes 40 within the illustrated region of FIG. 1 can be arranged such that a hypothetical structure, in which the gate line break region 40X is filled with an additional gate line structure (not shown) having the same width as the first gate line design shape 40 in area A and the second gate line shape 40 in area B, would include a periodic array of gate line design shapes that are periodic along the widthwise direction of the gate line design shapes 40 throughout the entirety of the illustrated region of FIG. 1.

The plurality of gate line design shapes 40 can be employed to form a gate level mask, which is a lithographic mask that can be employed to pattern gate lines out of a stack of a dielectric material layer and a gate conductor layer formed on a substrate.

If the plurality of gate line design shapes 40 includes a one-dimensional periodic array of line and space patterns, the semiconductor active regions as formed on the substrate can be a periodic array of semiconductor active regions having a uniform width and having a same pitch throughout.

In one embodiment, the illustrated region of FIG. 1 can be a unit cell of a period array of semiconductor devices. The unit cell can be repeated along a single direction or along two independent directions within the periodic array of semiconductor devices. In one embodiment, the periodic array can be repeated along the lengthwise direction of active region design shapes 20. In another embodiment, the periodic array can be repeated along the lengthwise direction of gate line design shapes 40. In yet another embodiment, the periodic array can be repeated along the lengthwise direction of active region design shapes 20 and along the lengthwise direction of gate line design shapes 40.

Figure 2:
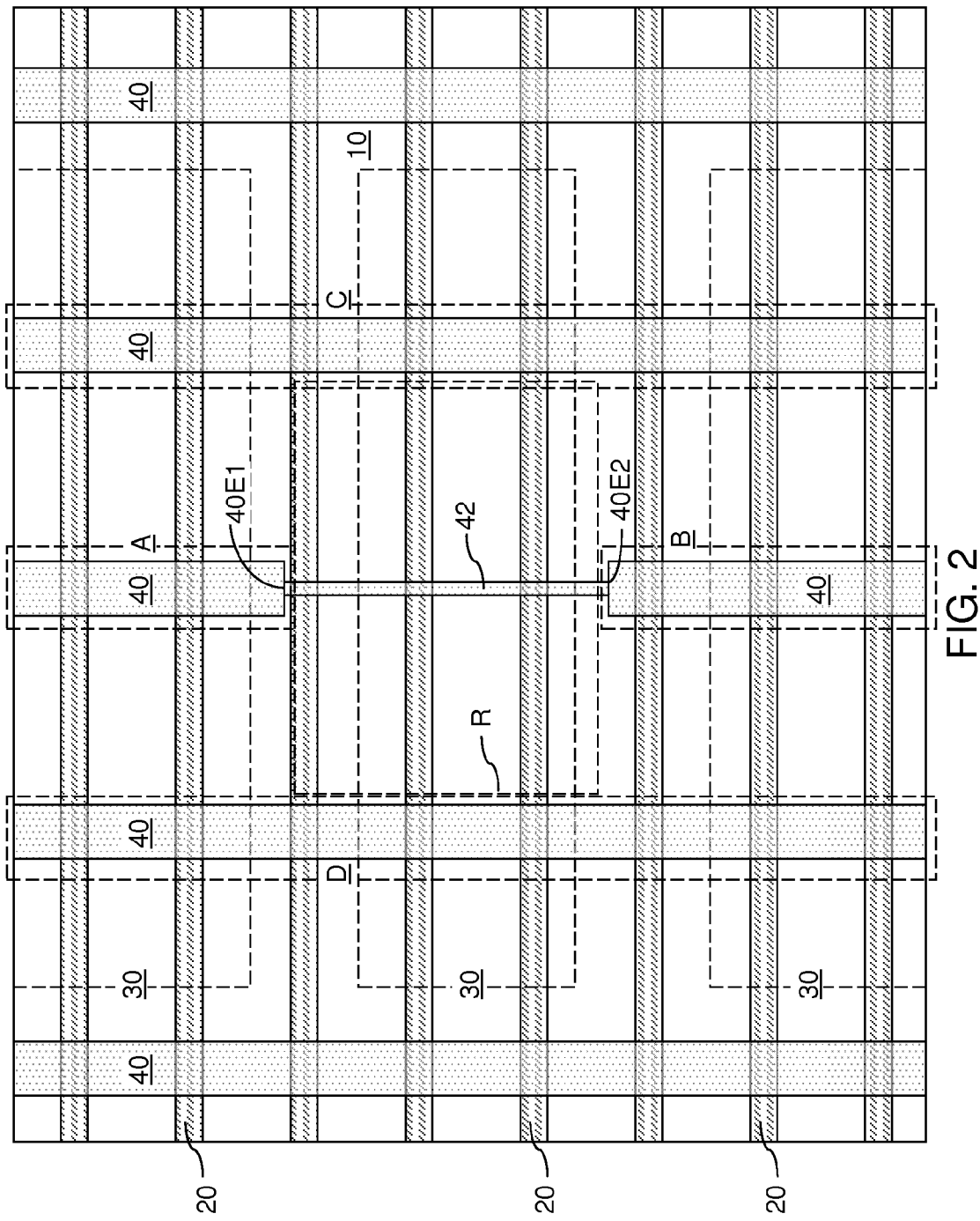
FIG. 2 is an exemplary design layout after addition of a sub-resolution assist feature (SRAF) according to an embodiment of the present disclosure.

Referring to FIG. 2, the exemplary design layout is modified by adding at least one design shape. Specifically, a region R that satisfies geometrical constraints is identified in the exemplary design layout. The identification of the region R can be performed employing an automated program that runs on a computer including one or more processors in communication with a memory and configured to run the automated program.

Specifically, the region R is identified in the design layout such that the region R meets the requirement of including a first gate line design shape 40 (e.g., in area A) representing a first gate line, a second gate line design shape 40 (e.g., in area B) representing a second gate line, and a third gate line design shape 40 (e.g., in area C) representing a third gate line. If all of the gate line design shapes 40 can extend along a same lengthwise direction, the lengthwise direction is herein referred to as the lengthwise direction of the gate line design shapes 40. The identified region R meets additional requirements that lengthwise edges of the first gate line design shape 40 (e.g., in area A) are collinear with lengthwise edges of the second gate line design shape 40 (e.g., in area B), and a first widthwise edge 40E1 of the first gate line design shape 40 is spaced from a second widthwise edge 40E2 of the second gate line design shape 40 by at least one portion of one or more active region design shapes 20 representing one or more semiconductor active regions. In addition, the identified region R meets the requirement that the third gate line design shape 40 (in area C) is parallel to the first and second gate line design shapes 40 (in areas A and B), and extends along the lengthwise direction of the gate line design shapes 40 farther than the widthwise edges (40E1, 40E2) of the first gate line design shape 40 (in area A) and the second gate line design shape 40 (in area B).

The region R may be bounded by a pair of parallel lines including the first widthwise edge 40E1 and the second widthwise edge 40E2, and a proximal edge of the third gate line design shape 40 and a proximal edge of a fourth gate line design shape 40 (e.g., in area D). In this case, the shape of the region R can be rectangular. As used herein, a proximal edge refers to an edge that is closest to a geometrical center of the region R among edges of neighboring design shapes.

The exemplary design layout can be modified by generating, and adding, a sub-resolution assist feature (SRAF) 42 to the exemplary design layout. The generation, and addition, of the SRAF 42 can be performed employing the automated program that runs on a computer including one or more processors in communication with a memory and configured to run the automated program. As used herein, an SRAF refers to a design shape that is added to a design layout in a manner such that a lithographic mask embodying the SRAF does not generate any pattern in an area corresponding to the SRAF. An SRAF includes at least one sublithographic dimension, i.e., a dimension that is less than a minimum dimension in a design shape that is required to induce formation of a printed pattern upon lithographic printing.

The added SRAF design shape 42 has a lesser width than the first and second gate line design shapes 40 (in areas A and B), and is adjoined to the widthwise edges (40E1, 40E2) of the first and second gate line design shapes 40, and straddles the at least one portion of the one or more active region design shapes 20 within the region R. In one embodiment, the first widthwise edge 40E1 of the first gate line design shape 40 (in area A) and the second widthwise edge 40E2 of the second gate line design shape 40 (in area B) do not overlie any active region design shape 20. The location of the added SRAF design shape 42 can be placed such that a widthwise edge of the SRAF design shape 42 can be coincident with a center portion of the first widthwise edge 40E1 of the first gate line design shape 40 (in area A), and another widthwise edge of the SRAF design shape 42 can be coincident with a center portion of the second widthwise edge 40E2 of the second gate line design shape 40 (in area B). In one embodiment, the geometrical center of a widthwise edge of the SRAF 42 can coincide with the geometrical center of the first widthwise edge 40E1, and the geometrical center of another widthwise edge of the SRAF 42 can coincide with the geometrical center of the second widthwise edge 40E2.

In one embodiment, lengthwise edges of the active region design shapes 20 are parallel to the widthwise edges (40E1, 40E2) of the first and second gate line design shapes 40 (in areas A and B). In one embodiment, the plurality of gate line design shapes further includes a fourth gate line design shape that is laterally spaced from the third gate line design shape by a same distance between the third gate line design shape and the first gate line design shape. The exemplary design layout can include the active region design shapes 30. An active region design shape 30 can be a rectangular design shape including edges that intersect active region design shapes 20 and representing locations at which semiconductor active regions are truncated during manufacturing.

Figure 3:
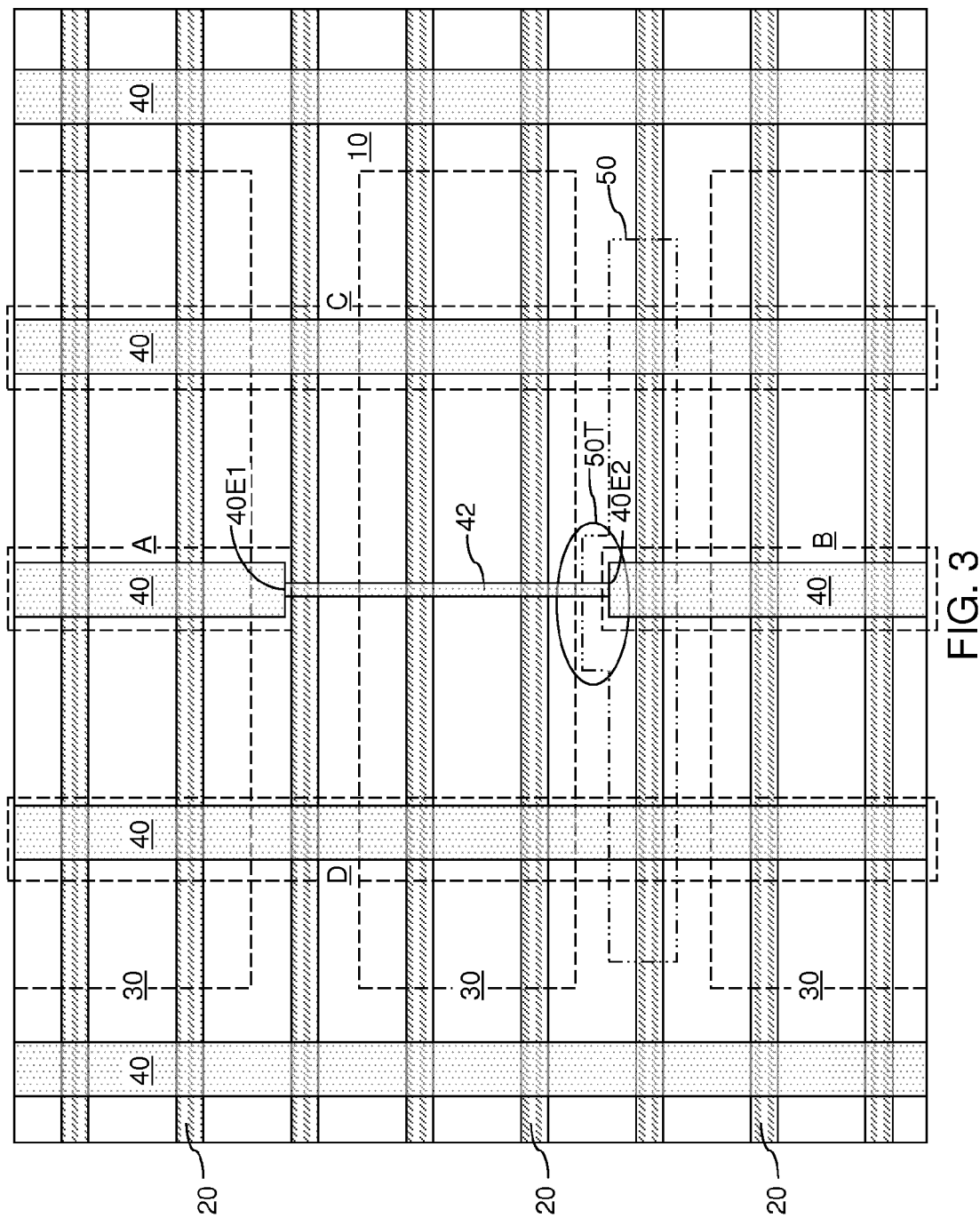
FIG. 3 is the exemplary design layout after addition of a cut design shape according to an embodiment of the present disclosure.
Figure 3A:
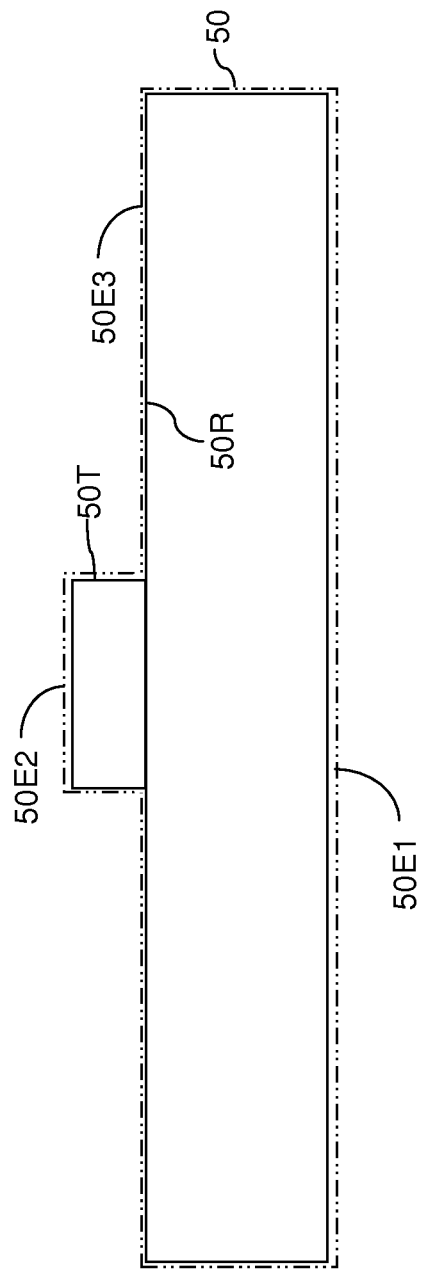
FIG. 3A is a magnified view of a cut design shape in FIG. 3 according to an embodiment of the present disclosure.

Referring to FIGS. 3 and 3A, the exemplary design layout can be optionally modified by adding a cut design shape 50. The location at which the cut design shape 50 can be inserted can be identified by an automated program that runs on a computer including one or more processors in communication with a memory and configured to run the automated program. Specifically, the need for a new cut design shape 50 to be added can be determined by determining whether the exemplary design layout requires a further modification of a first cut within the second gate line design shape 40 (in area B) and a second cut at least one of the third gate line design shape 40 (in area C) and the fourth gate line design shape 40 (in area D) such that the edge of the first cut and the edge of the second cut are within a same line extending along the widthwise direction of the gate line design shapes 40 (e.g., parallel to the second widthwise edge 40E2 of the second gate line design shape 40).

The location of an edge of the cut design shape 50 that extends along the direction perpendicular to the lengthwise direction of the gate line design shapes 40 can be bounded by the second widthwise edge 40E2 of the second gate line design shape 40 and a lengthwise edge of the active region design shapes 20 that is located within the region R (See FIG. 2) and is most proximal to the second widthwise edge 40E2. In one embodiment, the shape of the cut design shape 50 can include a rectangular shape component 50R and a tab shape component 50T such that the rectangular shape component 50R has a shape of a rectangle and the tab shape component 50T protrudes from the rectangular shape component 50R.

The entirety of an edge of the tab shape component 50T coincides with a portion of an edge of the rectangular shape component 50R. The tab shape component 50T has a smaller area than the rectangular shape component 50R. Edges of the tab shape component 50T that are parallel to the lengthwise direction of the gate line design shapes 40 are laterally offset inward from edges of the rectangular shape component 50R. A first edge of the rectangular shape component 50R straddles the second gate line design shape 40 (in area B) and at least one of the third gate line design shape 40 (in area C) and the fourth gate line design shape 40 (in area D). The first edge of the rectangular shape component can be parallel to the lengthwise edges of the active region design shapes 20, and can be parallel to the second widthwise edge 40E2 of the second gate line design shape 40 (in area B). A second edge of the rectangular shape component 50R straddles one of the third gate line design shape 40 (in area C) and the fourth gate line design shape 40 (in area D). The second edge of the rectangular shape component may straddle the second gate line design shape 40 (in area B), may overlap with the second widthwise edge 40E2 of the second gate line design shape 40, or may not intersect the second gate line design shape 40.

An edge of the tab shape component 50T that is most proximal to the first widthwise edge 40E1 of the first gate line design shape 40 (in area A) does not overlap with the second gate line design shape 40 (in area B), but is offset from the second widthwise edge 40E2 of the second gate line design shape 40 (in area B) by a active regionite distance. Further, the edge of the tab shape component 50T that is most proximal to the first widthwise edge 40E1 of the first gate line design shape 40 (in area A) is offset from the lengthwise edge of a active region design shape 40 that is most proximal to the second widthwise edge 40E1 and does not overlap with the second gate line design shape 40 (in area B).

In one embodiment, the cut design shape 50 can overlie a portion of the second gate line design shape 40 (in area B) and a portion of the third gate line design shape 40 (in area C). In another embodiment, the cut design shape includes a first edge 50E1 that intersects the second gate line design shape 40 (in area B) and the third gate line design shape 40 (in area C), a second edge 50E2 that is parallel to the first edge 50E1 and intersects the third gate line design shape 40, and a third edge 50E3 that is parallel to the first edge 50E1, does not intersect the second gate line design shape 40, and is laterally offset from the first edge 50E1 by a lesser distance than the second edge 50E2 is offset from the first edge 50E1.

In one embodiment, the second edge 50E2 is laterally offset with respect to the second widthwise edge 40E2 of the second gate line design shape 40 (in area B). In another embodiment, the cut design shape 50 can be T-shaped, i.e., have general geometrical features that include two rectangular portions such that one rectangular portion (i.e., the tab shape component 50T) meets another rectangular portion (i.e., the rectangular shape component 50R) at a middle portion of the other rectangular portion. In a further embodiment, the cut design shape 50 can include a rectangular portion (e.g., the rectangular shape component 50) and a protruding portion (e.g., the tab shape component 50T). The protruding portion (e.g., the tab shape component 50T) does not overlap with any of the active region design shapes 20. In one embodiment, rectangular portion (e.g., the rectangular shape component 50) can overlie a portion of a single semiconductor active region 20 among the active region design shapes 20.

The modified exemplary design layout can be employed to generate a set of lithographic masks. The set of lithographic masks is derived from the generated modified design layout. A semiconductor structure can be manufactured, which includes a plurality of semiconductor active regions and a plurality of gate line structures. The set of lithographic masks can be employed to pattern the semiconductor structure.

FIGS. 4-10 illustrate an exemplary semiconductor structure during a manufacturing process. The exemplary semiconductor structure can replicate the patterns illustrated in the exemplary design layout of FIG. 1 or FIG. 2.

Figure 4:
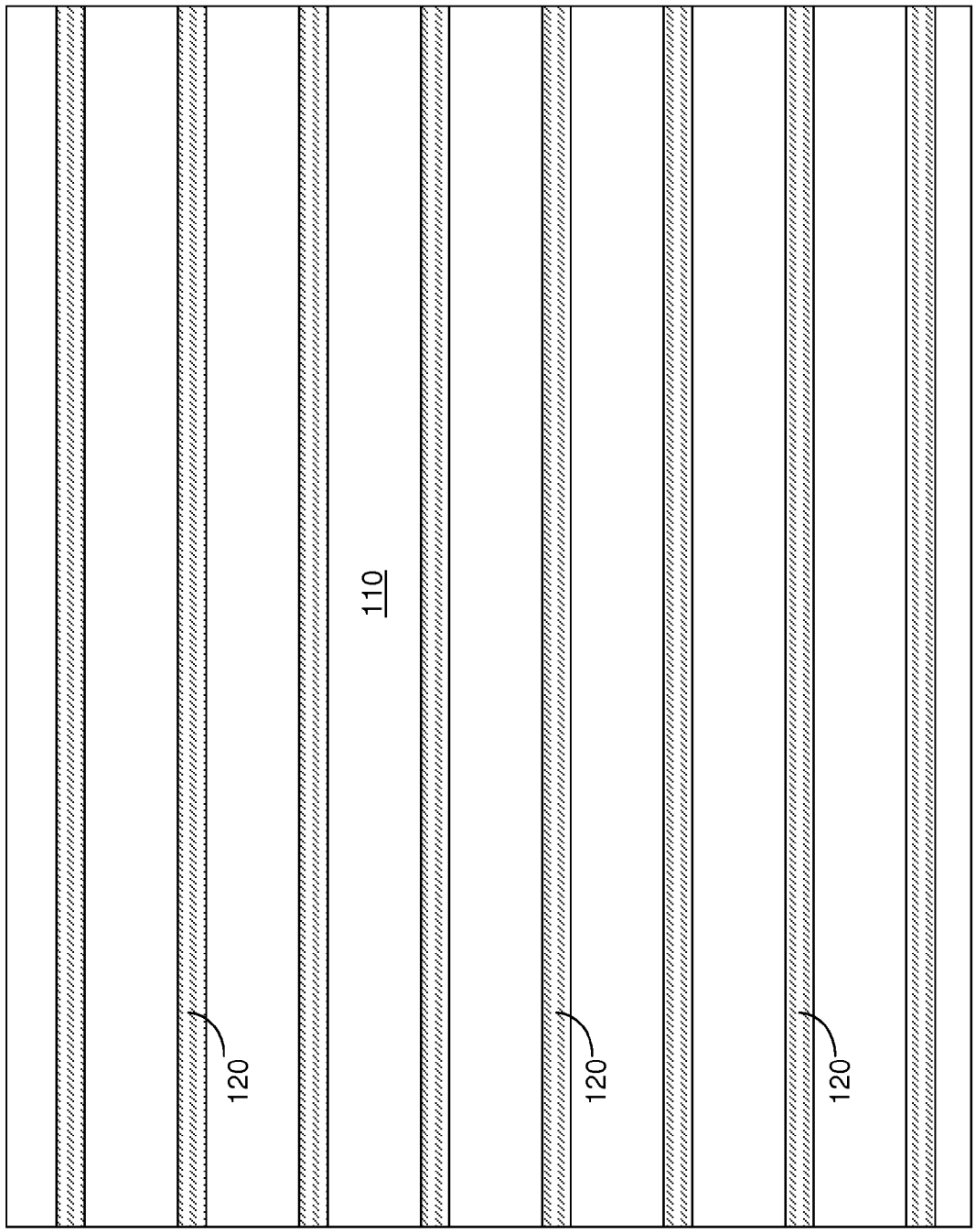
FIG. 4 is a top-down view of an exemplary semiconductor structure manufactured employing the exemplary design layout of FIG. 2 or FIG. 3 after formation of semiconductor active regions according to an embodiment of the present disclosure.

Referring to FIG. 4, semiconductor active regions 120 are manufactured on a substrate 110. The semiconductor active regions 120 can include a single crystalline semiconductor material such as single crystalline silicon. The substrate 110 can include an insulator layer contacting bottom surfaces of the semiconductor active regions, or can have any other configuration configured to provide electrical isolation among the semiconductor active regions 120. A active region level mask replicating the active region design shapes 20 can be employed to form the semiconductor active regions 120.

Figure 5:
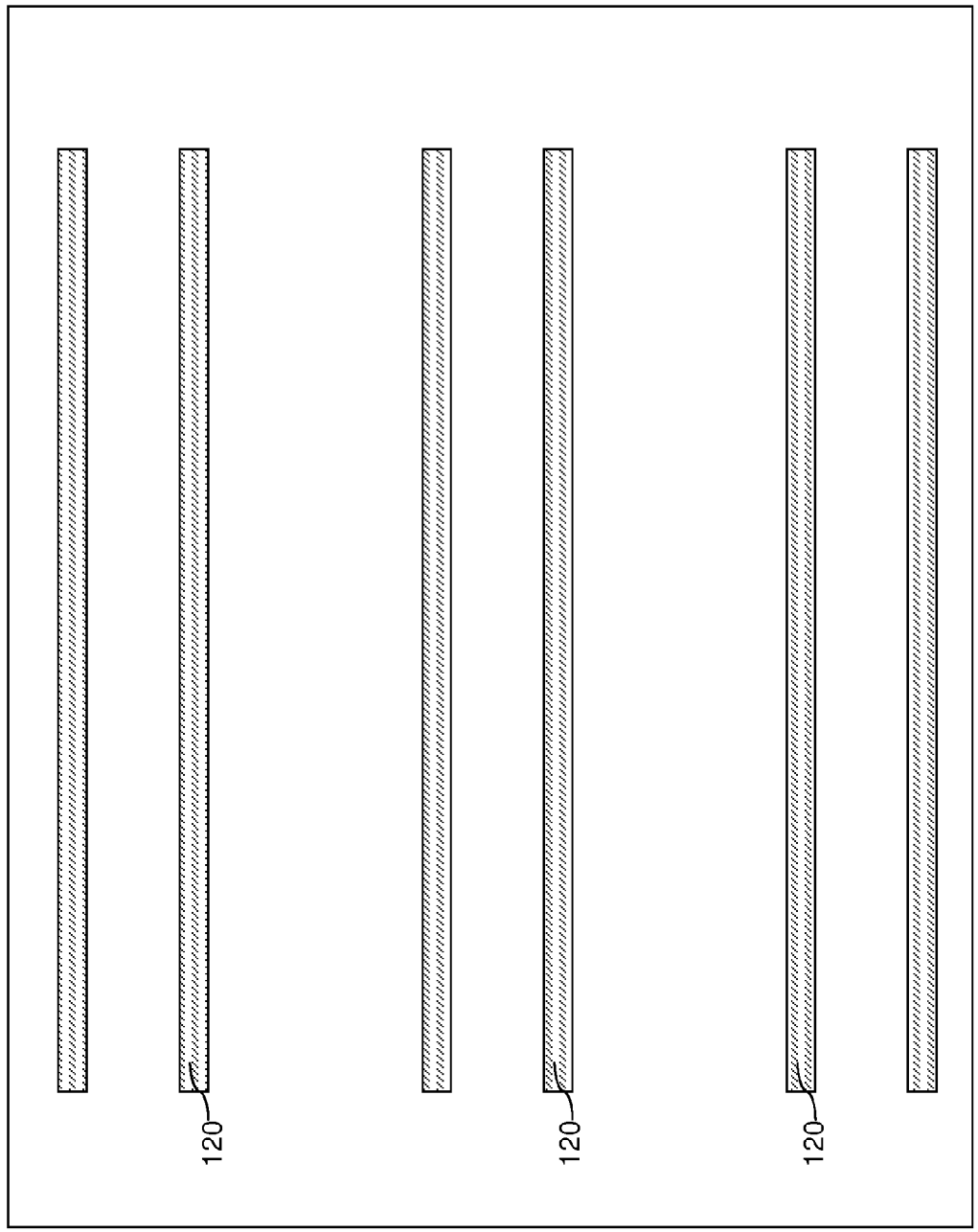
FIG. 5 is a top-down view of the exemplary semiconductor structure after patterning the semiconductor active regions according to an embodiment of the present disclosure.
Figure 6:
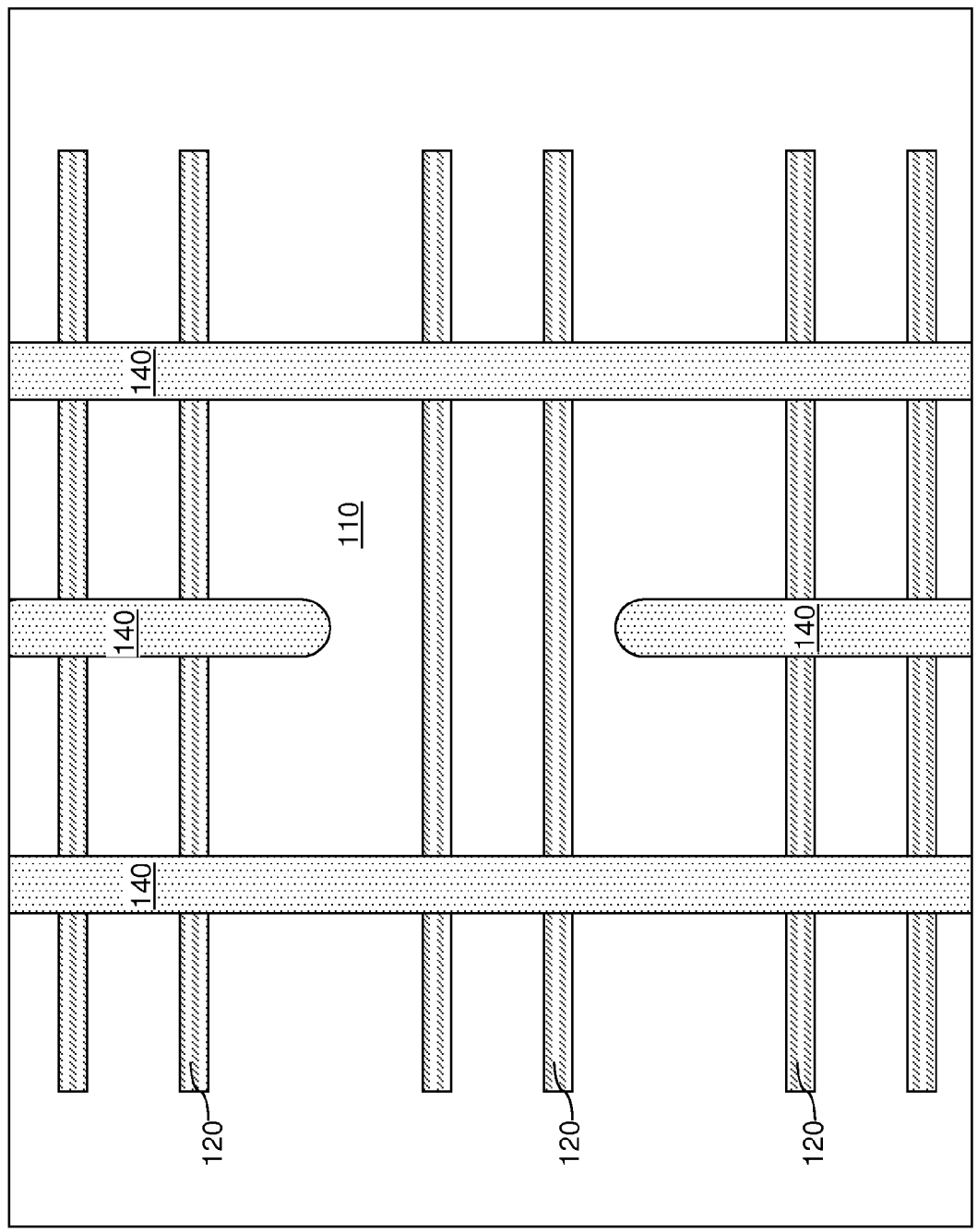
FIG. 6 is a top-down view of the exemplary semiconductor structure after formation of gate lines according to an embodiment of the present disclosure.

Referring to FIG. 5, the semiconductor active regions 120 can be patterned employing an active region level mask. The active region level mask defines the areas in which the semiconductor active regions 120 are to be present after patterning. The active region level mask replicates the active region design shapes 30 in a design layout.

Referring to FIG. 5, gate line structures 140 are formed across the semiconductor active regions 120. Each gate line structure 140 can include a vertical stack of a gate dielectric and a gate conductor, or can include a disposable gate material that is subsequently replaced with a permanent gate stack material, i.e., with a "replacement gate" structure. A gate level mask defines the areas in which the gate line structures 140 are to be formed. The gate level mask is a lithographic mask including patterns of the plurality of gate line design shapes 40 and the SRAF 42.

The area corresponding to the SRAF 42 does not form any gate line structure. In one embodiment, the lithographic conditions for reproducing the pattern of the gate level mask are set such that the SRAF 42 is not reproduced as a physical structure within the semiconductor structure. In one embodiment, the dimensions of the SRAF 42 can be selected such that the SRAF 42 is not reproduced within the entirety of the processing window for printing the gate line structures on the semiconductor substrate.

Figure 7:
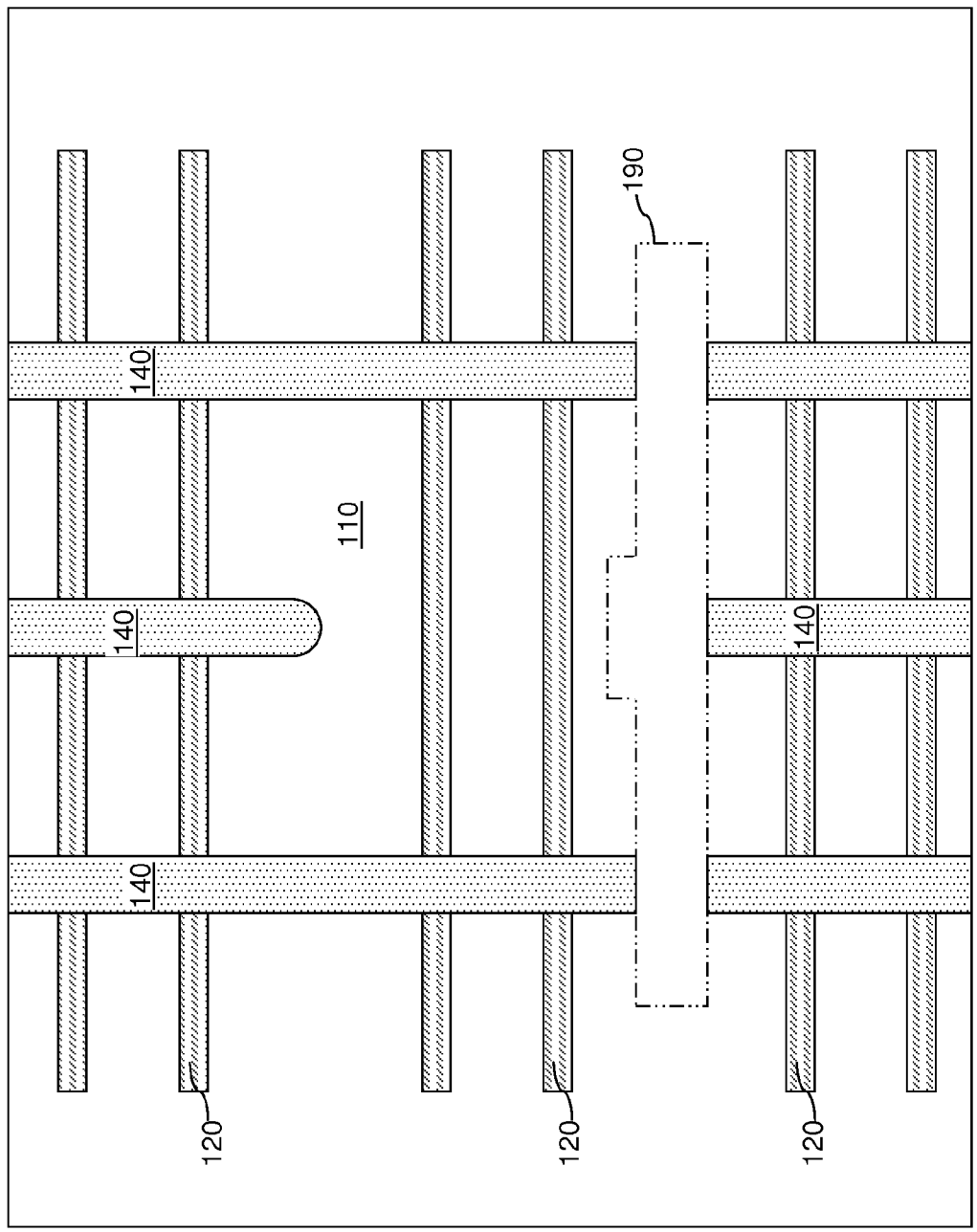
FIG. 7 is a top-down view of the exemplary semiconductor structure after etching portions of gate lines according to an embodiment of the present disclosure.

Referring to FIG. 7, a cut mask is employed to cut portions of the gate line structures 140 in areas corresponding to the cut design shape 50. The area of the portions of the gate line structures 140 can be defined, for example, by applying a photoresist layer over the entirety of the semiconductor structure, lithographically patterning the photoresist layer to form an opening within a cut area 190 corresponding to the geometry of the cut design shape 50, and etching any physically exposed portions of the gate line structures 140 from within the cut area 190, for example, by an anisotropic etch. The photoresist layer can be subsequently removed.

The presence of the protruding portion (i.e., the tab shape component 50T) within the cut design shape 50 facilitates removal of an end portion of a gate line structure corresponding to the second gate line design shape 40 (in area B; See FIG. 3) irrespective of overlay variations that is inherent in any lithographic process. Thus, the end portion of the gate line structure corresponding to the second gate line design shape 40 can be reliably removed within the entire process window for overlay variations between the gate line structures 140 and the cut area 190 as printed by the lithographic process.

Figure 8:
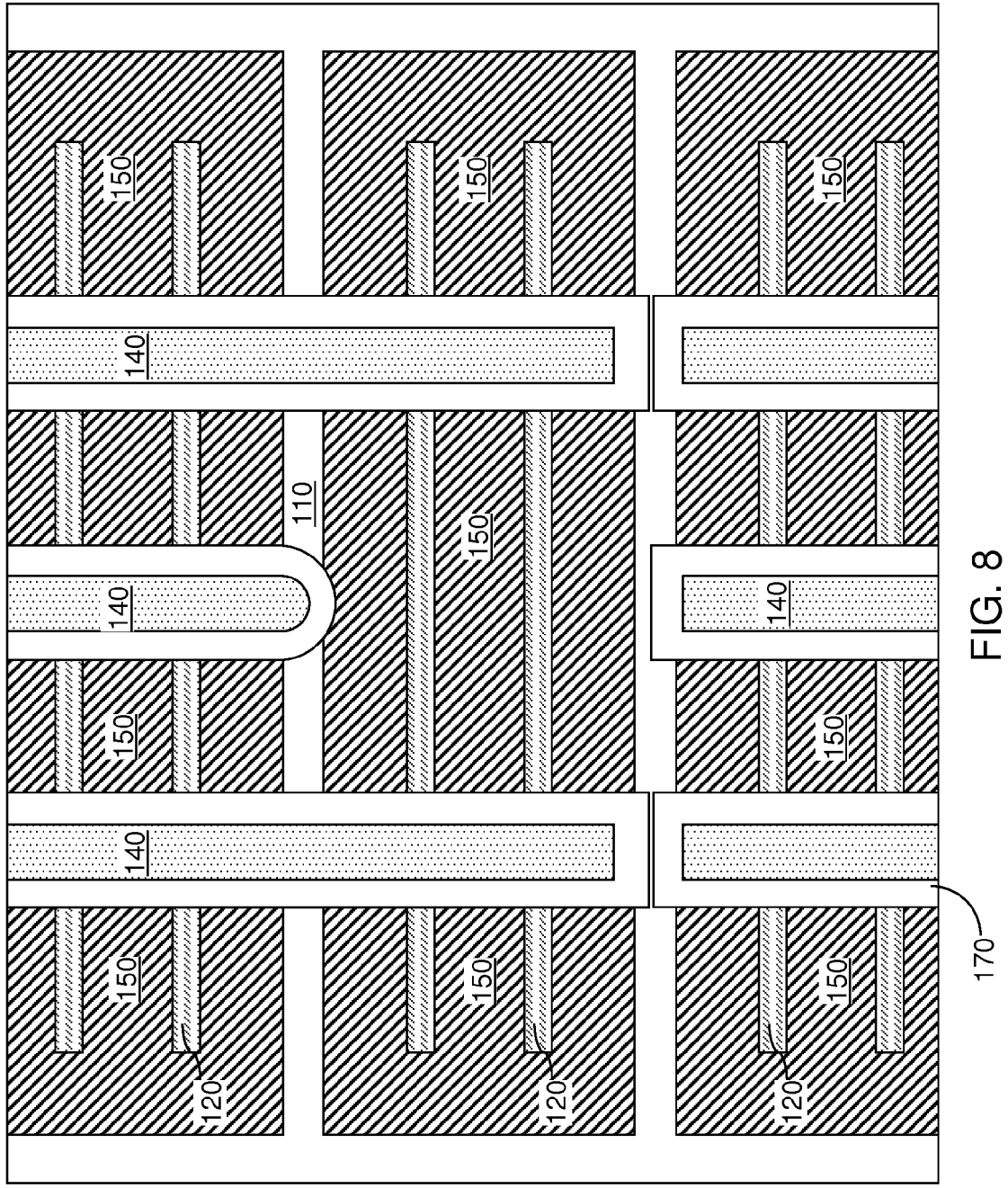
FIG. 8 is a top-down view of the exemplary semiconductor structure after formation of raised active regions according to an embodiment of the present disclosure.

Referring to FIG. 8, gate spacers 170 including a dielectric material can be formed on the sidewalls of the gate line structures 140. Subsequently, raised active regions 150 can be formed, for example, by selective epitaxy of a semiconductor material. As used herein, "raised active regions" collectively refer to raised source regions and raised drain regions. The raised active regions 150 can be in-situ doped during the selective epitaxy process, and/or can be doped by ion implantation. Removal of the end portion of the gate line structure corresponding the second gate line design shape 40 (in area B; See FIG. 3) enables manufacture of all raised active regions 150 within the semiconductor structure.

Figure 9:
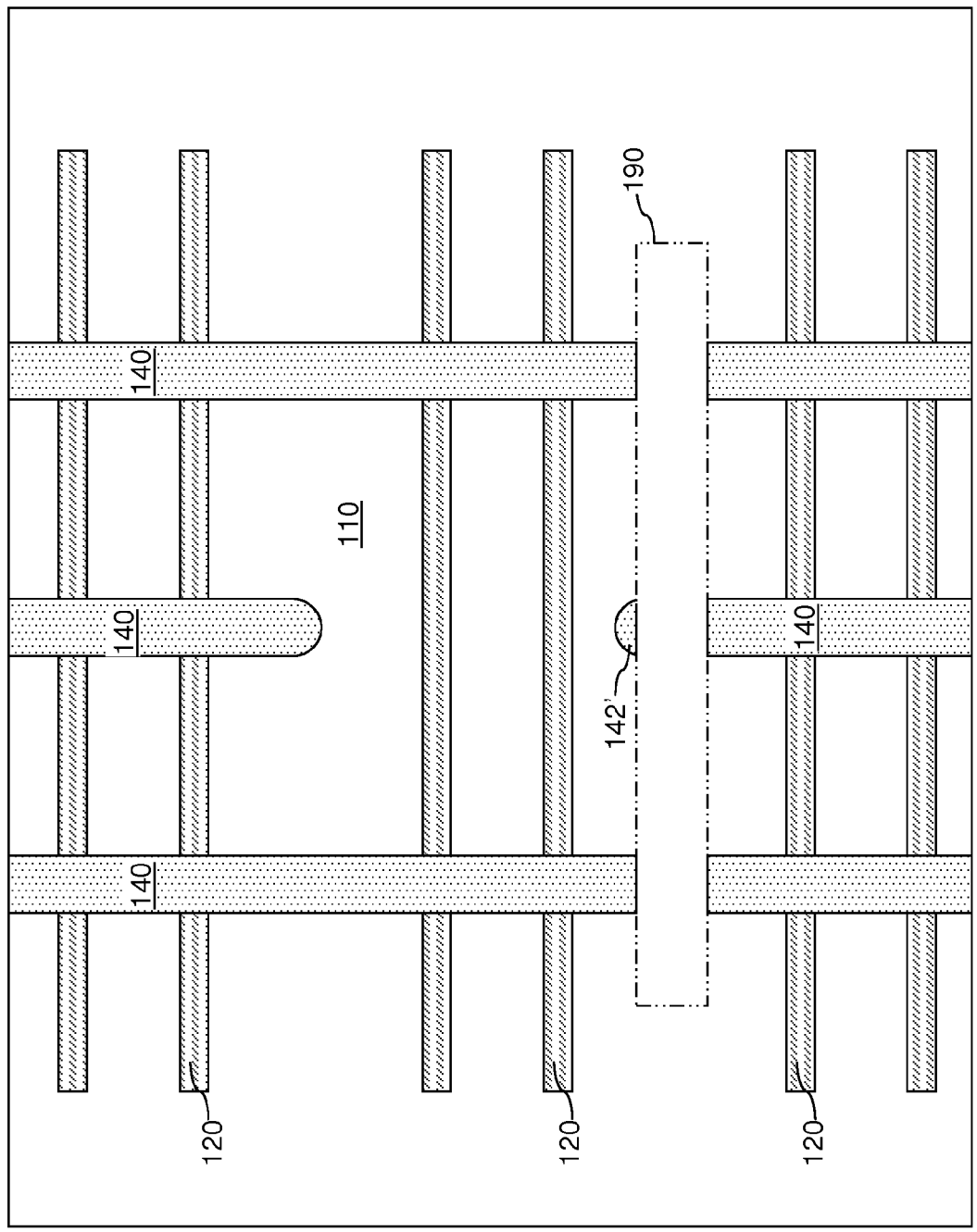
FIG. 9 is a top-down view of a comparative exemplary semiconductor structure after etching portions of gate lines.

Referring to FIG. 9, a comparative exemplary semiconductor structure is shown at a processing step of FIG. 7. The comparative exemplary semiconductor structure does not employ any protruding portion such as tab shape component illustrated in FIG. 3A. Absence of a protruding portion in the cut area 190 can cause formation of a residual gate line portion 142' on the semiconductor structure after removal of physically exposed portions of the gate line structures 140 within the cut area 190.

Figure 10:
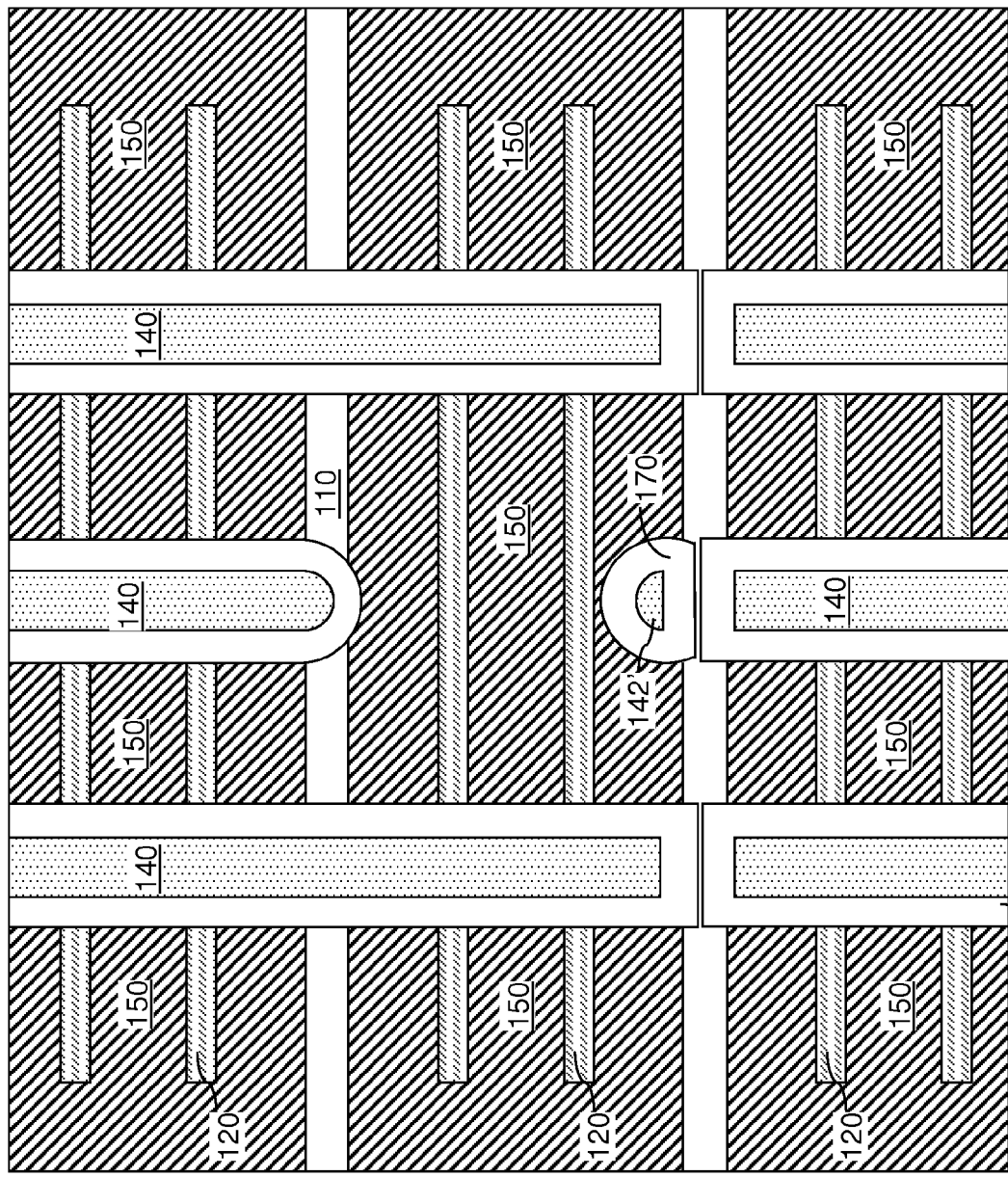
FIG. 10 is a top-down view of the comparative exemplary semiconductor structure after formation of raised active regions.

Referring to FIG. 10, the presence of the residual gate line portion 142' can induce formation of a gate spacer 170 on the sidewalls of the residual gate line portion 142'. Formation of such a gate spacer 170 can disturb formation of a raised active region 150 in at least one region of the comparative exemplary semiconductor structure. Thus, use of the protruding portion within the cut design shape 50 as illustrated in FIGS. 3 and 3A enables reliable manufacture of all raised active regions 150, thereby enabling scaling of semiconductor devices for technology nodes that employ short dimensions.

Referring to FIG. 11, an exemplary system is illustrated, which can be employed to implement the methods of various embodiments of the present disclosure. The exemplary system can be employed to generate design shapes for a design layout. The system including one or more processors in communication with a memory and configured to run an automated program including the processing steps described above.

The automated program can include instructions for performing any of the steps for analyzing, manipulating, and generating design shapes. In one embodiment, the system can include at least one computing means 910 including one or more processor units that are in communication with a memory. The at least one computing means 910 can include a computer as known in the art. The at least one computing means 910 can be in communication with a database 920, which can be a standalone computing means or can be incorporated into the at least one computing means 910. The database can store all or a subset of the design shapes for the design levels provided at step 610 or generated at later processing steps. If the database 920 is a standalone computing means, a data cable 930 or wireless communication can be employed to transfer data between the database 920 and the at least one computing means 910. The database can store information on process assumptions, and any or all of predefined parameters to be employed while the automated program runs.

The at least one computing means 910 can be employed to perform at least one or all of the steps described above with, or without, human intervention depending on the program that runs thereupon. The input data and the output data (e.g., the design for a pupil filter according to various embodiments of the present disclosure) can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in the first and/or second flow chart(s).

The design data can include the various design shapes for the design level as originally provided, and for each and/or all of the various mask level design layouts of the present disclosure. The design data for the mask level design layouts of the present disclosure can be transferred to a manufacturing facility that can manufacture a set of lithographic masks corresponding to the design shapes for the mask level design layouts. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the active regional structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

A machine-readable medium embodying the design data for the mask level design layouts of the present disclosure can have the functionality of generating a representation, in a format perceptible by humans or recognizable by an automated machine (such as an optical character reader or a program configured to recognize graphics data), of a semiconductor structure, a semiconductor device, a semiconductor circuit, or any other physical implementation of the devices and structures of the present disclosure. The design data for the mask level design layouts of the present disclosure, as embodied in the machine-readable medium, can be organized such that the inherent physical or logical relationship among data elements can be represented in a temporary or permanent display device such as a computer monitor or at least one printed sheet of paper. Further, the design data for the mask level design layouts of the present disclosure can be designed to support specific data manipulation functions, including, but not limited to, editing, adding, subtracting, or otherwise modifying or modulating the various data elements within the design data for the mask level design layouts. In addition, the design data for the mask level design layouts of the present disclosure can be configured to cause the representation in the format perceptible by humans or recognizable by an automated machine to include various display elements (e.g., line, curves, symbols, areas, volumes, etc.) that correspond to each of the various data elements within the design data for the mask level design layouts. The design data for the mask level design layouts of the present disclosure can be a functional descriptive material as recorded on the machine-readable medium, and as such, can become structurally and functionally interrelated to the machine-readable medium so as to change the format and organization of the various memory elements within the machine-readable medium and confer a functionality of generating at least one visual representation when read by a display program, which can be a visual display program or a printing program, and can reside in a computing device, or can be encoded within the same machine-readable medium, or can be encoded within a different machine-readable medium that can be read by the same computing device that reads the machine-readable medium encoding the design data for the mask level design layouts of the present disclosure.

In one embodiment, a machine-readable medium embodying the design data for the mask level design layouts of the present disclosure can additionally encode a computer program that enables the generation of a representation, in a format perceptible by humans or recognizable by an automated machine. In one embodiment, the computer program that enables the generation of a representation, in a format perceptible by humans or recognizable by an automated machine can reside in a computing device or in another machine-readable medium that can be read by a computing device configured to read the machine-readable medium embodying the design data for the mask level design layouts of the present disclosure.

Upon running of the computer program on the design data for the mask level design layouts of the present disclosure, a representation of the design data for the t mask level design layouts can be generated in a format perceptible by humans or recognizable by an automated machine, which can be employed to design, manufacture, and/or to test any of a semiconductor structure, a semiconductor device, a semiconductor circuit, or any other physical implementation of the devices, structures and/or circuits of the present disclosure as embodied in the design data for the mask level design layouts. Alternately or additionally, a representation of the design data for the mask level design layouts as generated in a format perceptible by humans or recognizable by an automated machine can be employed to design, manufacture, and/or to test any design for a semiconductor structure, a semiconductor device, a semiconductor circuit, or any other physical implementation of the devices and structures of the present disclosure as embodied in the design data for the mask level design layouts.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method for generating at least one design shape for a design layout, said method comprising:
   providing a design layout including a plurality of gate line design shapes and active region design shapes;
   identifying a region in said design layout, said region comprising a first gate line design shape representing a first gate line, a second gate line design shape representing a second gate line, and a third gate line design shape representing a third gate line, wherein lengthwise edges of said first gate line design shape are collinear with lengthwise edges of said second gate line design shape, a widthwise edge of said first gate line design shape is spaced from a widthwise edge of said second gate line design shape by at least one portion of one or more active region design shapes representing one or more semiconductor active regions, and said third gate line design shape defining a boundary of said region, is parallel to said first and second gate line design shapes, and extends along a lengthwise direction farther than a distance between said widthwise edges of said first gate line design shape and said second gate line design shape; and
   generating, and adding to said design layout, a sub-resolution assist feature (SRAF) design shape by running an automated program on a computer including one or more processors in communication with a memory and configured to run said automated program, wherein said SRAF design shape has a lesser width than said first and second gate line design shapes and is adjoined to said widthwise edges of said first and second gate line design shapes and straddles said at least one portion of said one or more active region design shapes.

2. The method of claim 1, wherein said widthwise edge of said first gate line design shape and said widthwise edge of said second gate line design shape do not overlie any active region design shape.

3. The method of claim 1, wherein lengthwise edges of said active region design shapes are parallel to said widthwise edges of said first and second gate line design shapes.

4. The method of claim 1, wherein said plurality of gate line design shapes further comprises a fourth gate line design shape that is laterally spaced from said third gate line design shape by a same distance between said third gate line design shape and said first gate line design shape.

5. The method of claim 1, wherein said design layout further comprises a rectangular design shape including edges that intersect said active region design shapes and representing locations at which semiconductor active regions are truncated during manufacturing.

6. The method of claim 1, further comprising adding a cut design shape overlying a portion of said second gate line design shape and a portion of said third gate line design shape.

7. The method of claim 6, wherein said cut design shape includes a first edge that intersects said second gate line design shape and said third gate line design shape, a second edge that is parallel to said first edge and intersects said third gate line design shape, and a third edge that is parallel to said first edge, does not intersect said second gate line design shape, and is laterally offset from said first edge by a lesser distance than said second edge is offset from said first edge.

8. The method of claim 7, wherein said second edge is collinear with said widthwise edge of said second gate line design shape.

9. The method of claim 6, wherein said cut design shape is T-shaped and includes a rectangular portion and a protruding portion, wherein said protruding portion does not overlap with any of said active region design shapes.

10. The method of claim 9, wherein said rectangular portion overlies a portion of a single semiconductor active region among said active region design shapes.

11. A method of manufacturing a semiconductor structure, said method comprising:
    generating a modified design layout by:
      providing a design layout including a plurality of gate line design shapes and active region design shapes;
      identifying a region in said design layout, said region comprising a first gate line design shape representing a first gate line, a second gate line design shape representing a second gate line, and a third gate line design shape representing a third gate line, wherein lengthwise edges of said first gate line design shape are collinear with lengthwise edges of said second gate line design shape, a widthwise edge of said first gate line design shape is spaced from a widthwise edge of said second gate line design shape by at least one portion of one or more active region design shapes representing one or more semiconductor active regions, and said third gate line design shape defining a boundary of said region, is parallel to said first and second gate line design shapes, and extends along a lengthwise direction farther than a distance between said widthwise edges of said first gate line design shape and said second gate line design shape; and
      generating, and adding to said design layout, a sub-resolution assist feature (SRAF) design by running an automated program on a computer including one or more processors in communication with a memory and configured to run said automated program, wherein said SRAF design shape has a lesser width than said first and second gate line design shapes and is adjoined to said widthwise edges of said first and second gate line design shapes and straddles said at least one portion of said one or more active region design shapes;
    manufacturing a set of lithographic masks derived from said generated modified design layout; and
    manufacturing a semiconductor structure including a plurality of semiconductor active regions and a plurality of gate line structures employing said set of lithographic masks to pattern said semiconductor structure.

12. The method of claim 11, further comprising setting lithographic conditions for reproducing a pattern of a lithographic mask including patterns of said plurality of gate line design shapes so that said SRAF is not reproduced as a physical structure within said semiconductor structure.

13. A system for generating shapes for a design layout, said system comprising one or more processors in communication with a memory and configured to run an automated program comprising instructions, which when executed by said computer, performs processing steps including:

receiving a design layout including a plurality of gate line design shapes and active region design shapes;

identifying a region in said design layout, said region comprising a first gate line design shape representing a first gate line, a second gate line design shape representing a second gate line, and a third gate line design shape representing a third gate line, wherein lengthwise edges of said first gate line design shape are collinear with lengthwise edges of said second gate line design shape, a widthwise edge of said first gate line design shape is spaced from a widthwise edge of said second gate line design shape by at least one portion of one or more active region design shapes representing one or more semiconductor active regions, and said third gate line design shape defining a boundary of said region, is parallel to said first and second gate line design shapes, and extends along a lengthwise direction farther than a distance between said widthwise edges of said first gate line design shape and said second gate line design shape; and generating, and adding to said design layout, a sub-resolution assist feature (SRAF) design shape, wherein said SRAF design shape has a lesser width than said first and second gate line design shapes and is adjoined to said widthwise edges of said first and second gate line design shapes and straddles said at least one portion of said one or more active region design shapes.

14. The system of claim 13, wherein said widthwise edge of said first gate line design shape and said widthwise edge of said second gate line design shape do not overlie any active region design shape.

15. The system of claim 13, wherein lengthwise edges of said active region design shapes are parallel to said widthwise edges of said first and second gate line design shapes.

16. The system of claim 13, wherein said plurality of gate line design shapes further comprises a fourth gate line design shape that is laterally spaced from said third gate line design shape by a same distance between said third gate line design shape and said first gate line design shape.

17. The system of claim 13, wherein said design layout further comprises a rectangular design shape including edges that intersect said active region design shapes and representing locations at which semiconductor active regions are truncated during manufacturing.

18. The system of claim 13, wherein said processing steps further comprise a step of adding a cut design shape overlying a portion of said second gate line design shape and a portion of said third gate line design shape.

19. The system of claim 18, wherein said cut design shape includes a first edge that intersects said second gate line design shape and said third gate line design shape, a second edge that is parallel to said first edge and intersects said third gate line design shape, and a third edge that is parallel to said first edge, does not intersect said second gate line design shape, and is laterally offset from said first edge by a lesser distance than said second edge is offset from said first edge, and said second edge is collinear with said widthwise edge of said second gate line design shape.

20. The system of claim 18, wherein said cut design shape is T-shaped and includes a rectangular portion and a protruding portion, wherein said protruding portion does not overlap with any of said active region design shapes, and said rectangular portion overlies a portion of a single semiconductor active region among said active region design shapes.

\* \* \* \* \*